(12) United States Patent
Tsai

(10) Patent No.: US 10,146,349 B2
(45) Date of Patent: Dec. 4, 2018

(54) TOUCH DISPLAY DEVICE

(71) Applicant: InnoLux Corporation, Jhu-Nan, Miao-Li (TW)

(72) Inventor: Chia-Hao Tsai, Miao-Li (TW)

(73) Assignee: INNOLUX CORPORATION, Jhu-Nan, Miao-Li County (TW)

(*) Notice: Subject to any disclaimer, the term of this patent is extended or adjusted under 35 U.S.C. 154(b) by 0 days.

(21) Appl. No.: 15/664,594

(22) Filed: Jul. 31, 2017

(65) Prior Publication Data

US 2018/0052552 A1  Feb. 22, 2018

(30) Foreign Application Priority Data

Aug. 22, 2016 (TW) .............................. 105126806 A

(51) Int. Cl.
*G06F 3/041* (2006.01)
*G06F 3/044* (2006.01)
*G09G 3/32* (2016.01)
*H01L 27/32* (2006.01)

(52) U.S. Cl.
CPC .......... *G06F 3/0412* (2013.01); *G06F 3/044* (2013.01); *G09G 3/32* (2013.01); *H01L 27/323* (2013.01); *G06F 2203/04102* (2013.01); *G06F 2203/04105* (2013.01); *G09G 2310/08* (2013.01); *G09G 2354/00* (2013.01)

(58) Field of Classification Search
CPC ...... G06F 3/0412; G06F 3/044; G06F 1/1652; G09G 3/32; G09G 3/3258; H01L 27/323

USPC .......................................................... 345/174
See application file for complete search history.

(56) References Cited

U.S. PATENT DOCUMENTS

| | | | |
|---|---|---|---|
| 9,658,710 B2* | 5/2017 | Yang | G09G 3/32 |
| 2017/0031389 A1* | 2/2017 | Yoo | G06F 1/1652 |
| 2017/0269747 A1* | 9/2017 | Hu | G06F 3/0412 |
| 2018/0114487 A1* | 4/2018 | He | G09G 3/3258 |
| 2018/0197462 A1* | 7/2018 | Nagayama | G09G 3/32 |

FOREIGN PATENT DOCUMENTS

TW  201445707 A  12/2014

* cited by examiner

*Primary Examiner* — Fred Tzeng
(74) *Attorney, Agent, or Firm* — Muncy, Geissler, Olds & Lowe, P.C.

(57) ABSTRACT

A touch display device includes a thin-film transistor (TFT) substrate and a light-emitting element. The TFT substrate has a substrate and a TFT structure. The TFT structure is disposed on the substrate and includes a driving transistor. The light-emitting element is disposed on the TFT structure and has a first end electrode, a light-emitting layer and a second end electrode. The first end electrode is electrically connected with the driving transistor. The light-emitting layer is disposed between the first end electrode and the second end electrode. The first end electrode or the second end electrode is a touch sensing electrode of the touch display device.

20 Claims, 18 Drawing Sheets

TOUCH DISPLAY DEVICE

CROSS REFERENCE TO RELATED APPLICATIONS

This Non-provisional application claims priority under 35 U.S.C. § 119(a) on Patent Application No(s). 105126806 filed in Taiwan, Republic of China on Aug. 22, 2016, the entire contents of which are hereby incorporated by reference.

BACKGROUND

Technical Field

The present disclosure relates to a touch display device and, in particular, to a touch display device.

Related Art

With the progress of technologies, various information devices, such as mobile phones, tablet computers, UMPC, and GPS, have been invented and introduced into our lives. Except the conventional input tools such as the keyboard or mouse, the intuitional touch input technology has been developed and becomes a popular operation method. Since the touch device has a humanized and intuitional input operation interface, the users of any ages can simply and directly use the finger or stylus to click or operation the information device.

One of the most popular touch control technologies is the 2D multi-touch technology, which can precisely determine a touch position (e.g. touched by a finger) for generating the corresponding control function. Except the 2D multi-touch technology, a capacitance pressure sensing method is adapted to sense the pressing force on the direction perpendicular to the display surface (Z axis) to generate the corresponding control function.

SUMMARY

The present disclosure provides a touch display device, which includes a thin-film transistor (TFT) substrate and a light-emitting element. The light-emitting element can be, for example, an organic light-emitting diode, inorganic light-emitting diode or quantum dot light-emitting diode, and the disclosure is not limited. The TFT substrate has a substrate and a TFT structure. The TFT structure is disposed on the substrate and includes a driving transistor. The light-emitting element is disposed on the TFT structure and has a first end electrode, a light-emitting layer and a second end electrode. The first end electrode is electrically connected with the driving transistor. The light-emitting layer is disposed between the first end electrode and the second end electrode. The first end electrode or the second end electrode is a touch sensing electrode of the touch display device.

The present disclosure also provides a touch display device, which includes a TFT substrate, a light-emitting element and a touch sensing electrode. The TFT substrate has a substrate and a TFT structure. The TFT structure is disposed on the substrate and includes a driving transistor. The light-emitting element is disposed on the TFT structure and has a first end electrode, a light-emitting layer and a second end electrode. The first end electrode is electrically connected with the driving transistor, and the light-emitting layer is disposed between the first end electrode and the second end electrode. The touch sensing electrode is disposed above the second end electrode or between the first end electrode and the substrate, and located corresponding to the first end electrode or the second end electrode.

The present disclosure further provides a touch display device, which includes a TFT substrate, a light-emitting element and a reference electrode. The TFT substrate has a substrate and a TFT structure. The TFT structure is disposed on the substrate and includes a driving transistor. The light-emitting element is disposed on the TFT structure and has a first end electrode, a light-emitting layer and a second end electrode. The first end electrode is electrically connected with the driving transistor, and the light-emitting layer is disposed between the first end electrode and the second end electrode. The reference electrode is disposed corresponding to the first end electrode or the second end electrode.

BRIEF DESCRIPTION OF THE DRAWINGS

The embodiments will become more fully understood from the detailed description and accompanying drawings, which are given for illustration only, and thus are not limitative of the present disclosure, and wherein.

DETAILED DESCRIPTION OF THE DISCLOSURE

The embodiments of the disclosure will be apparent from the following detailed description, which proceeds with reference to the accompanying drawings, wherein the same references relate to the same elements. Moreover, the drawings of all implementation are schematic, and they do not mean the actual size and proportion. The terms of direction recited in the disclosure, for example up, down, left, right, front, or rear, only define the directions according to the accompanying drawings for the convenience of explanation but not for limitation. In addition, if one element is formed on, above, under, or below another element, these two elements can be directly contact with each other or not directly contact with each other but have an addition element disposed therebetween. The names of elements and the wording recited in the disclosure all have ordinary meanings in the art unless otherwise stated. Therefore, a person skilled in the art can unambiguously understand their meanings.

Figure 1A:
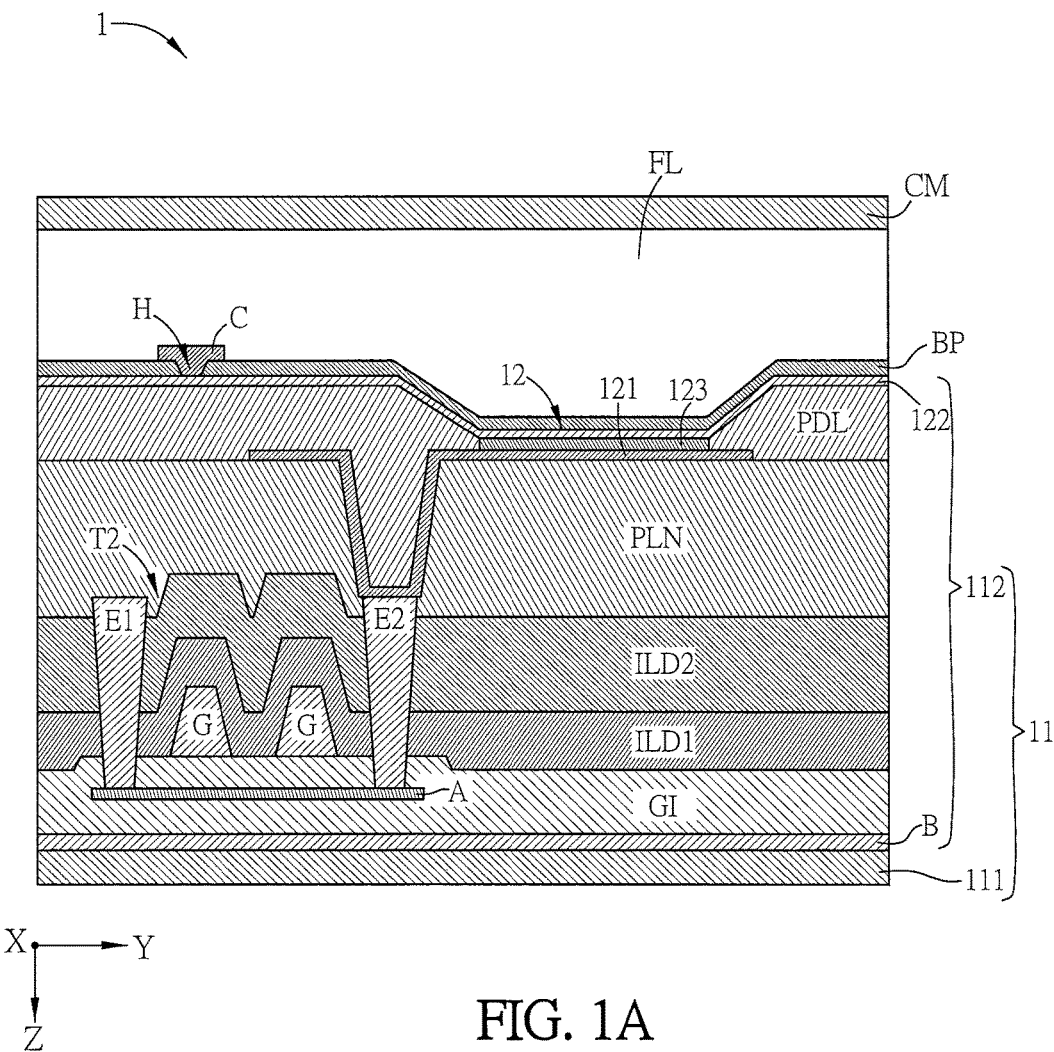
FIG. 1A is a sectional view of a part of a touch display device according to an embodiment of the disclosure.
Figure 1B:
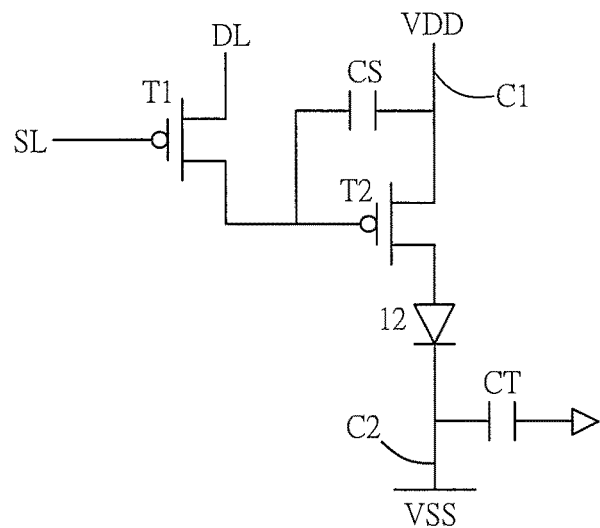
FIG. 1B is an equivalent circuit diagram of a pixel structure of the touch display device according to the embodiment of the disclosure.
Figure 1C:
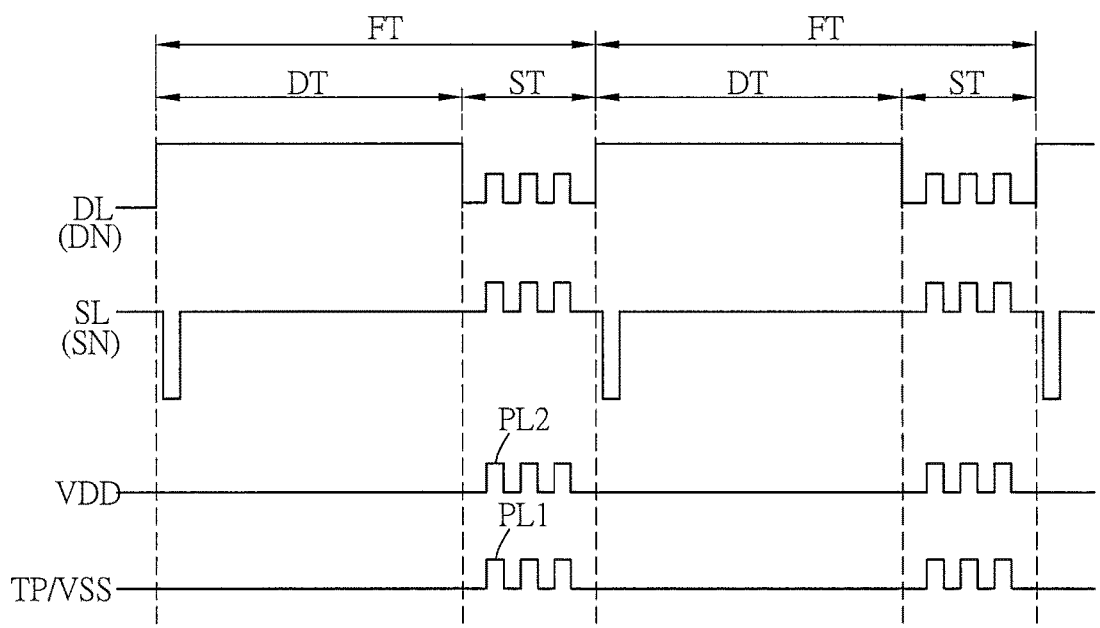
FIG. 1C is a timing chart of a part-time driving mode of the touch display device according to the embodiment of the disclosure.
Figure 1D:
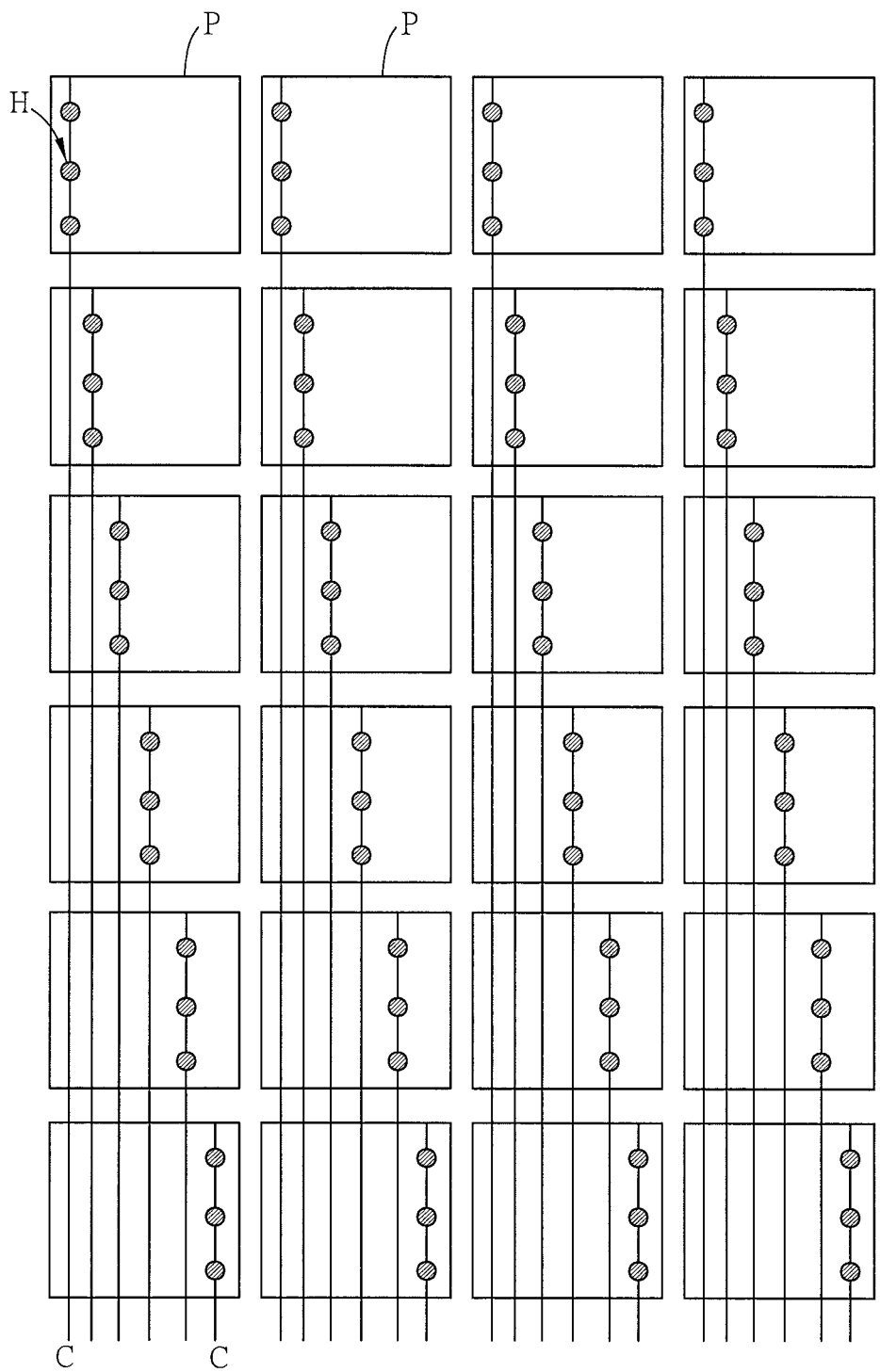
FIG. 1D is a top view of a touch sensing electrode according to the embodiment of the disclosure.

FIG. 1A is a sectional view of a part of a touch display device 1 according to an embodiment of the disclosure. FIG. 1B is an equivalent circuit diagram of a pixel structure of the touch display device 1 according to the embodiment of the disclosure. FIG. 1C is a timing chart of a part-time driving mode of the touch display device 1 according to the embodiment of the disclosure. FIG. 1D is a top view of a touch sensing electrode according to the embodiment of the disclosure.

The touch display device 1 is an active matrix touch display device, such as a smart phone, a tablet computer, an UMPC, a wearable device, or any other displayer with touch control function, and this disclosure is not limited.

As shown in FIG. 1A, the touch display device 1 includes a thin-film transistor (TFT) substrate 11 and at least one light-emitting element 12. In addition, the touch display device 1 of the embodiment further includes a pixel defining layer PDL, a barrier layer BP, a trace C, a flexible layer FL, and a covering plate CM.

The TFT substrate 11 includes a substrate 111 and a TFT structure 112, which is disposed on the substrate 111. The substrate 111 can be rigid plate or a flexible plate and be transparent or opaque. For example, the rigid plate is a glass, and the flexible plate is a flexible substrate made of, for example but not limited to, polyimide (PT) or polyethylene terephthalate (PET). In addition, the TFT structure 112 includes a plurality of transistor structures corresponding to the plurality of light emitting elements 12. The transistor structures and the light emitting elements 12 can form a plurality of pixel structures, which are arranged in a 2D array.

As shown in FIG. 1B, an equivalent circuit of a pixel structure is a 2T1C circuit, which includes a control transistor T1, a driving transistor T2, a storage capacitor CS, and a light emitting element 12. The gate of the control transistor T1 is coupled to a scan line SL, a first end of the control transistor T1 is coupled to a data line DL, and a second end of the control transistor T1 is coupled to the gate of the driving transistor T2. The first end of the driving transistor T2 is coupled to a first power source VDD through a first power line C1. Two ends of the storage capacitor CS are coupled to the gate and the first end of the driving transistor T2, respectively. The second end of the driving transistor T2 is coupled to the anode of the light emitting element 12, and the cathode of the light emitting element 12 is coupled to a second power source VSS through a second power line C2. In this embodiment, the touch control capacitance CT is the self-capacitance change of the touch sensing electrode when the user touches the touch display device 1. In this case, the control transistor T1 and the driving transistor T2 are both PMOS transistors, for example. Of course, in other embodiments, the control transistor T1 and the driving transistor T2 can be both NMOS transistors, and this disclosure is not limited. Besides, in some embodiments, the equivalent circuit of a pixel structure can be a 4T2C circuit, a 5T1C circuit, a 6T1C circuit, a 7T2C circuit, or other configurations, and this disclosure is not limited.

FIG. 1A shows the light emitting element 12 and the driving transistor T2 of the TFT structure 112 of a pixel structure, and the control transistor T1 and the storage capacitor CS are not shown. Herein, the light emitting element 12 is disposed on the TFT structure 112 and includes a first end electrode 121, a second end electrode 122, and a light-emitting layer 123. The first end electrode 121 is electrically connected with the second end of the driving transistor T2, and the light-emitting layer 123 is disposed between the first end electrode 121 and the second end electrode 122. In this case, the light emitting element 12 can be, for example, a light-emitting diode (LED), an organic light-emitting diode (OLED), inorganic light-emitting diode or quantum dot light-emitting diode, and the disclosure is not limited. When applying a forward bias to the light emitting element 12, it can emit light.

In addition, the TFT structure 112 further includes a buffer layer B, a first dielectric layer ILD1, a second dielectric layer ILD2, and a planarization layer PLN.

The buffer layer B is disposed on the substrate 111, and the driving transistor T2 is disposed above the buffer layer B. The driving transistor T2 includes a gate G, a gate insulation layer GI, a channel layer A, a first electrode E1, and a second electrode E2. In this case, the driving transistor T2 is a top-gate thin-film transistor. In other embodiments, the driving transistor T2 can be a bottom-gate thin-film transistor, and this disclosure is not limited.

The gate insulation layer GI is disposed on the buffer layer B, and the channel layer A is disposed on the gate insulation layer GI and located corresponding to the gate G. In this embodiment, the gate insulation layer GI is configured to cover the channel layer A. The gate insulation layer GI is made of silicon oxygen compound or inorganic material, such as silicon nitride, silicon oxide, silicon oxynitride, silicon carbide, alumina oxide, hafnium oxide, or multilayers of the above materials. In practice, the channel layer A includes, for example, low temperature poly-silicon (LTPS), amorphous silicon, or metal oxide. The above-mentioned metal oxide is, for example but not limited to, indium gallium zinc oxide (IGZO).

The first electrode E1 and the second electrode E2 are disposed on the channel layer A, and one end of the first electrode E1 and one end of the second electrode E2 are contacted with the channel layer A. When the channel layer A of the driving transistor T2 is not conducted, the first electrode E1 and the second electrode E2 are electrically disconnected. The first electrode E1 and the second electrode E2 can be a single-layer structure or a multilayer structure made of metal (e.g. aluminum, copper, silver, molybdenum, or titanium) or alloy thereof. Besides, the first electrode E1 and the second electrode E2 can be a transparent conductive layer, such as ITO, IZO or ITZO. Moreover, the wires for transmitting signals can be manufactured with the same process and the same layer as the first electrode E1 and the second electrode E2 (e.g. the data lines (not shown in FIG. 1A)).

The gate G is disposed on the gate insulation layer GI and located corresponding to the channel layer A. In this embodiment, the gate G is disposed above the channel layer A. The gate G can be a single-layer structure or a multilayer structure made of metal (e.g. aluminum, copper, silver, molybdenum, or titanium) or alloy thereof. Besides, the gate G can be a transparent conductive layer, such as ITO, IZO or ITZO. Moreover, the electrically connected wires for transmitting signals can be manufactured with the same process and the same layer as the gate G (e.g. the scan lines (not shown in FIG. 1A)). In addition, the first dielectric layer ILD1 covers the gate insulation layer GI and the gate G, and the second dielectric layer ILD2 covers the first dielectric layer ILD1.

In this embodiment, the first electrode E1 and the second electrode E2 are coupled with the channel A by the via (not shown) through the gate insulation layer GI, the first dielectric layer ILD1 and the second dielectric layer ILD2. In other embodiments, the first electrode E1 and the second electrode E2 can be coupled with the channel A through the opening of an etch stop layer, which are disposed at one ends of the first electrode E1 and the second electrode E2, and this disclosure is not limited.

The planarization layer PLN covers the second dielectric layer ILD2. The first end electrode 121 is disposed on the planarization layer PLN, and electrically coupled to the second electrode E2 through a via (not shown). The pixel defining layer PDL is disposed on the first end electrode 121 and filled in the via of the planarization layer PLN. The light-emitting layer 123 and the second end electrode 122 are disposed on the first end electrode 121 in order, and the second end electrode 122 covers the pixel defining layer PDL. In this embodiment, the first end electrode 121 is, for example, the anode of the light emitting element 12, and the second end electrode 122 is, for example, the cathode of the light emitting element 12. In other embodiments, the first end electrode 121 can be the cathode of the light emitting element 12, and the second end electrode 122 can be the anode of the light emitting element 12.

The material of the first end electrode 121 or the second end electrode 122 can comprise, for example but not limited to, ITO, IZO, AZO, CTO, $SnO_2$, ZnO, ITO/Ag/ITO, or magnesium alloy. In some embodiments, when the touch display device 1 emits light upwardly, the first end electrode 121 can be made of opaque metal material, and the second end electrode 122 can be made of transparent material. In addition, when the touch display device 1 emits light downwardly, the first end electrode 121 can be made of transparent material, and the second end electrode 122 can be made of opaque metal material.

The covering plate CM is disposed opposite to the substrate 111, and the TFT structure 112 and the light emitting element 12 are disposed between the cover plate CM and the substrate 111. The cover plate CM can be a rigid plate (e.g. glass) or a flexible plate (e.g. flexible substrate). In addition, the barrier layer BP is an insulation layer and covers the second end electrode 122. The trace C is disposed on the barrier layer BP and passes through a through hole H of the barrier layer BP to couple with the second end electrode 122. In this case, the trace C is disposed at the top side of the second end electrode 122. In other embodiments, the trace C can be disposed at the bottom side of the second end electrode 122 or at the top or bottom side of the first end electrode 121. This disclosure is not limited. Moreover, a sealant (not shown) can be provided to seal the flexible layer FL between the cover plate CM and the barrier layer BP. The sealant is, for example, a UV gel, frit, or the likes, and the flexible layer FL is, for example, an air layer (e.g. nitrogen or inert gas), a flexible material layer, or an inorganic complex layer (inorganic/organic/inorganic). For example, the flexible material layer is made of OCA, LOCA, OCR, SVR, silicon gel, or polyimide (PI). In this disclosure, the flexible layer FL can be deformed by pressing and is recoverable.

When the scan lines SL of the touch display device 1 receive the scan signals to turn on the transistors T1, the corresponding data lines DL receive the data signals to charge the storage capacitors CS. Afterwards, the storage voltage of the storage capacitor CS can control to turn on the driving transistor T2, so that the first power source VDD (e.g. +5V) and the second power source VSS (e.g. 0V) apply the positive bias to the light emitting element 12 of the pixel structure to enable the light emitting element 12 to emit light. Accordingly, the touch display device 1 can display the image.

In order to reduce the manufacturing processes of the touch panel and utilize less components, the first end electrode 121 or the second end electrode 122 can be functioned as a touch sensing electrode of the touch display device 1. In this embodiment, the second end electrode 122 is functioned as a touch sensing electrode of the touch display device 1 for sensing the touch motion of the user. The touch display device 1 is an in-cell touch display device having a touch control mode based on the self-capacitance change. Herein, the circuit for controlling the touch function and the circuit for controlling the display function can be integrated in the same IC, so that the manufacturing processes and materials of the touch panel can be reduced so as to control the total manufacturing cost. To be noted, the above-mentioned touch sensing electrode (the second end electrode 122) can sense the touch motion in two directions (the first direction X and the second direction Y (the X-Y plane)).

As shown in FIG. 1D, the second end electrode 122 (the cathode) of the light emitting element 12 is functioned as the touch sensing electrode. In this case, the second end electrode 122 is a patterned electrode structure, which is functioned as the electrode pad for sensing. In this embodiment, the touch sensing electrode of the touch display device 1 includes a plurality of electrode pads P, each of which is electrically connected to at least one trace C. The trace C of this embodiment can provide the second power source VSS during the display period and provide the driving (sensing) signals to the electrode pads P of the touch sensing electrode during the (touch) sensing period. These electrode pads P are arranged in a 2D array, and each electrode pad P corresponds to one or more pixel structures (one or more light emitting elements 12). This disclosure is not limited. In other embodiments, the first end electrode 121 (anode) is functioned as the touch sensing electrode. Herein, the second end electrode 122 of each light emitting element 12 is a patterned structure, and each electrode pad P corresponds to one pixel structure. In other embodiments, the first end electrode 121 (anode) is functioned as the touch sensing electrode. Herein, the first end electrode 121 is not a common electrode, which means the first end electrode 121 is not a whole plate of touch sensing electrode. Accordingly, each touch sensing electrode corresponds to one of electrode pads P.

As shown in FIG. 1D, each electrode pad P is electrically connected to the trace C via three through holes H (corresponding to the through hole H of FIG. 1A). That is, the trace C is electrically connected with the electrode pad P of the touch sensing electrode (the second end electrode 122) via the three through holes H. When the finger touches the cover plate CM to change the capacitance sensed by the electrode pad P, the electric signal can be transmitted to the control IC through the trace C, thereby recognizing the touch position and thus generating the corresponding control action.

In this embodiment, the driving modes of the touch display device 1 include a full-time driving mode and a part-time driving mode. In the full-time driving mode, the touch sensing electrode (the second end electrode 122) can provide a plurality of driving signals TP (e.g. pulses) during the frame time FT so as to obtain the touch signals corresponding to the capacitance change of the touch capacitor CT. In the part-time driving mode, as shown in FIG. 1C, a frame time FT of the touch display device 1 includes a display period DT and a sensing period ST. During the display period DT, the scan signals SN are sent to the scan lines SL and the data signals DN are sent to the data lines DL for displaying the image. During the sensing period ST, the driving signal TP is sent to the touch sensing electrode for sensing the touch motion of the user. In this embodiment, the driving signal TP is the signal of the second power source VSS.

During the sensing period ST in the part-time driving mode, at least one first pulse signal PL1 (the driving signal TP) is sent to the touch sensing electrode, and at least one second pulse signal PL2 is sent to the first power line C1 or the second power line C2. The first pulse signal PL1 is corresponding to and identical to the second pulse signal PL2. In more detailed, the first pulse signal PL1 and the second pulse signal PL2 are transmitted within the same time, and the pulse size (voltage difference) thereof are the same. In this embodiment, the first pulse signal PL1 (the driving signal TP), which is sent to the touch sensing electrode, is corresponding to and identical to the second pulse signal PL2 of the first power source VDD, which is transmitted through the first power line C1.

In other words, the signal of the first power source VDD can change depending on the driving signal TP sent to the touch sensing electrode. The reason of this configuration is that the current flowing through the light emitting element 12 may be changed, which will affect the lighting effect, if the driving signal TP (the first pulse signal PL1) is only transmitted to the touch sensing electrode. Accordingly, the waveform of the second pulse signal PL2 of the first power source VDD must be corresponding to and identical to the waveform of the first pulse signal PL1 transmitted to the touch sensing electrode so as to decrease the interference of the change of the current flowing through the light emitting element 12. Thus, the driving signal TP transmitted to the touch sensing electrode cannot affect the lighting effect of the light emitting element 12. During the sensing period ST, the waveform of the scan signal SN transmitted to the scan line SL and the waveform of the data signal DN transmitted to the data line DL are corresponding to and identical to the waveforms of the driving signal TP (the second power source VSS) and the first power source VDD. This configuration can prevent the overloading of the touch sensing electrode so as to maintain the touch control quality of the touch display device.

In some embodiments, the driving transistor T2 can be controlled in a cutoff status during the sensing period ST, so that the light emitting element 12 does not emit light during this period. In this case, the driving signal TP during the sensing period ST cannot affect the lighting of the light emitting element 12. In more specific, during the sensing period ST, the voltage applied to the first power line C1 (the first power source VDD) is less than the voltage applied to the second power line C2 (the second power source VSS). For example, the first power line C1 is directly grounded, so that the voltage of the first power source VDD is 0V. Accordingly, the light emitting element 12 is applied with a non-positive bias or a negative bias and is thus not lighting, thereby preventing the undesired interference of the light effect of the light emitting element 12. Otherwise, the first power line C1 can be floated to achieve the above effect, and this disclosure is not limited. In some embodiments, a switch transistor is connected to the second end of the driving transistor T2 in serial for controlling the lighting of the light emitting element 12.

In order to compensate the reduced lighting during the sensing period ST, in some embodiments, the light emitting element 12 is driven by a overdrive mode (increasing the cross voltage) during the display period DT, so that the light emitting element 12 can have a higher brightness. Utilizing the overdrive method to compensate the reduced lighting of the light emitting element 12 during the sensing period ST makes the average brightness in this frame time FT to be the same as the average brightness of the normal frame with the light emitting element to be lighted for entire frame time. Thus, the entire display effect is not interfered.

To be noted, the threshold voltage (Vth) of the transistor may have shift during the full-time mode or the part-time mode due to the factors of different manufacturing processes, materials or component characteristics of the thin-film transistors of the active touch display device 1. In this case, the driving currents of the LEDs of the pixel structures may have slight differences when applying the same data voltage, so that the display image of the touch display device 1 will have non-uniform brightness, which may cause the mura effect. In order to improve the above, in some embodiments, a pixel compensating circuit is provided to compensate the non-uniform brightness caused by the shift of the threshold voltage (Vth) of the driving transistor.

Figure 2A:
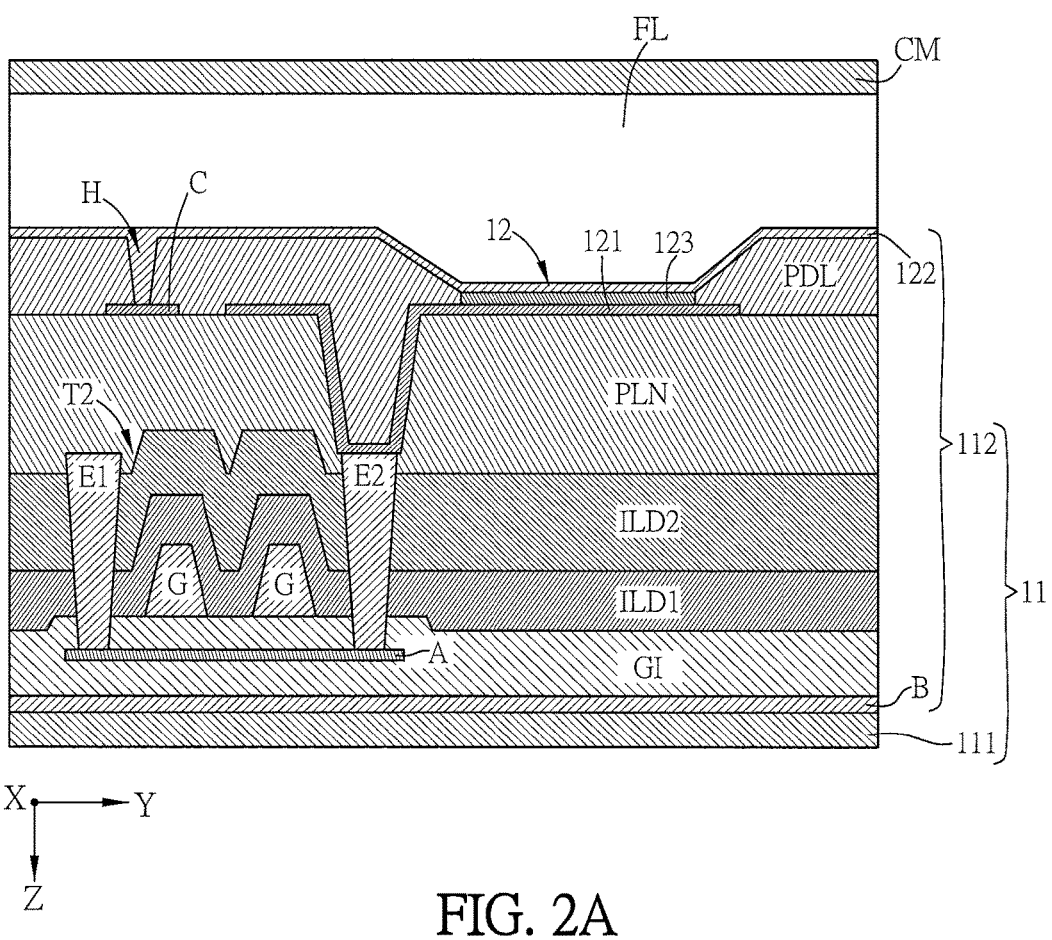
FIGS. 2A to 2C are sectional views of a part of touch display devices according to various embodiments of the disclosure.
Figure 2B:
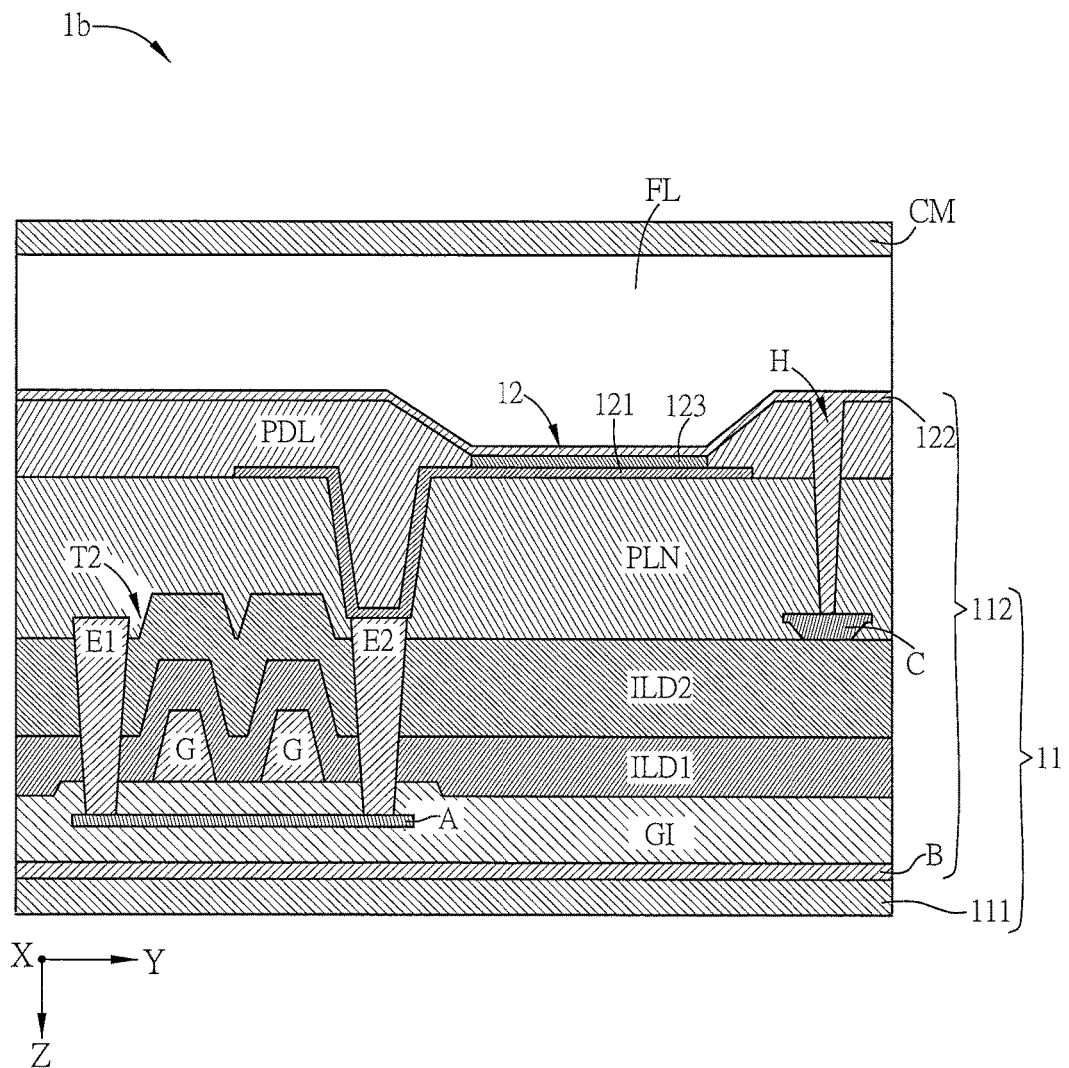
Figure 2C:
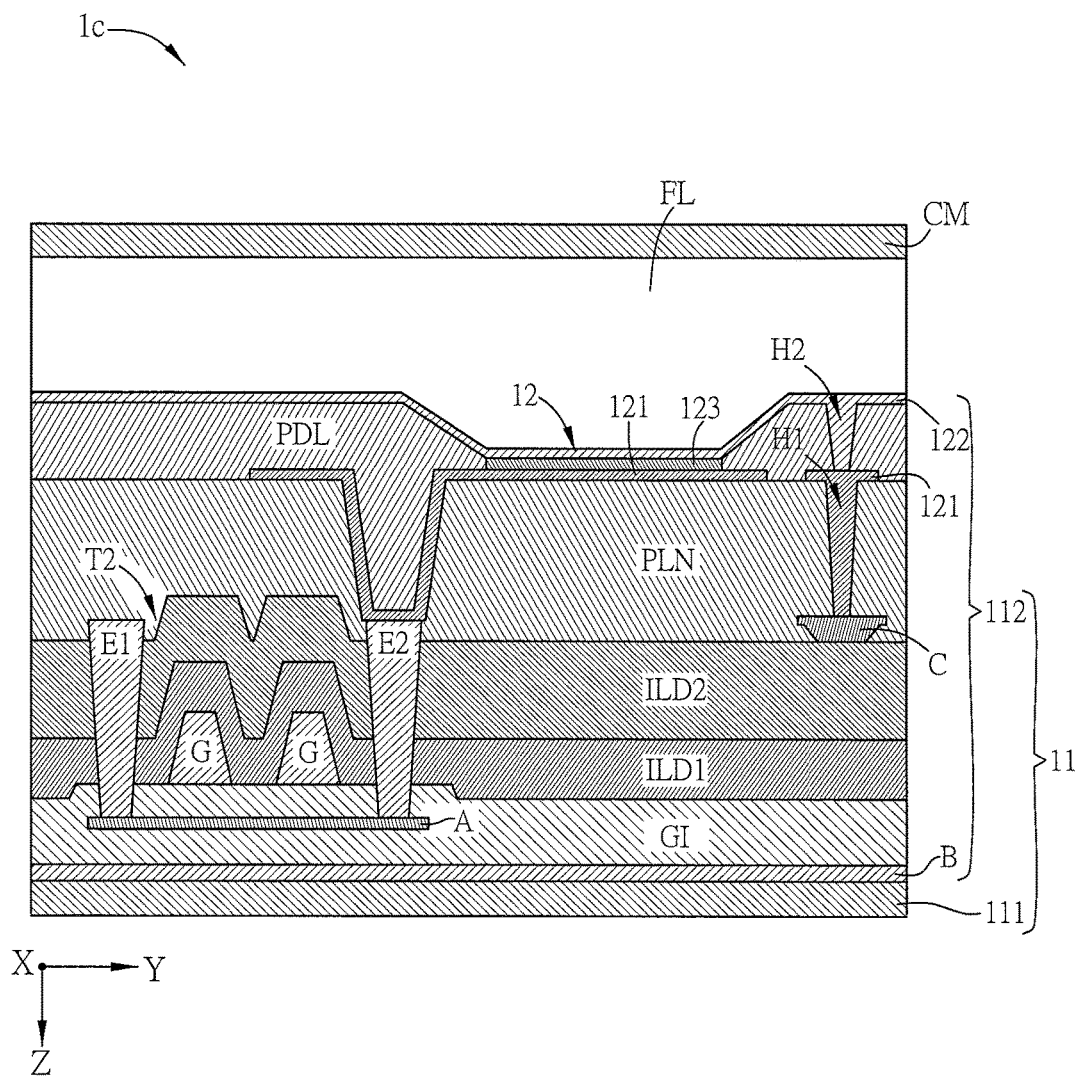

FIGS. 2A to 2C are sectional views of a part of touch display devices 1a~1c according to various embodiments of the disclosure.

Different from FIG. 1A, the touch display device 1a of FIG. 2A is not configured with the barrier layer BP, and the trace C and the first end electrode 121 are manufactured by the same process and material. In addition, the through hole H is disposed on the pixel defining layer PDL, so that the material of the second end electrode 122 can be filled into the through hole H and electrically connected with the trace C under the second end electrode 122.

Different from FIG. 1A, the touch display device 1b of FIG. 2B is not configured with the barrier layer BP, and the trace C is disposed on the second dielectric layer ILD2 and is manufactured by the same process and material as the first electrode E1 or the second electrode E2. In addition, the through hole H is disposed on the pixel defining layer PDL and the planarization layer PLN, so that the material of the second end electrode 122 can be filled into the through hole H and electrically connected with the trace C on the second dielectric layer ILD2.

Different from FIG. 2B, the through hole H1 of the planarization layer PLN of the touch display device 1c is filled with the material the same as the first end electrode 121, and the material of the second end electrode 122 is filled into the through hole H2 of the pixel defining layer PDL so as to electrically connected with the material in the through hole H1. Accordingly, the second end electrode 122 can be coupled to the trace C via the through holes H1 and H2. In some embodiments, the through holes H1 and H2 can be misaligned and not overlapped.

The other technical features, driving method and controlling method of the touch display devices 1a~1c can be referred to the same components of the touch display device 1, and the detailed descriptions thereof will be omitted.

Figure 3:
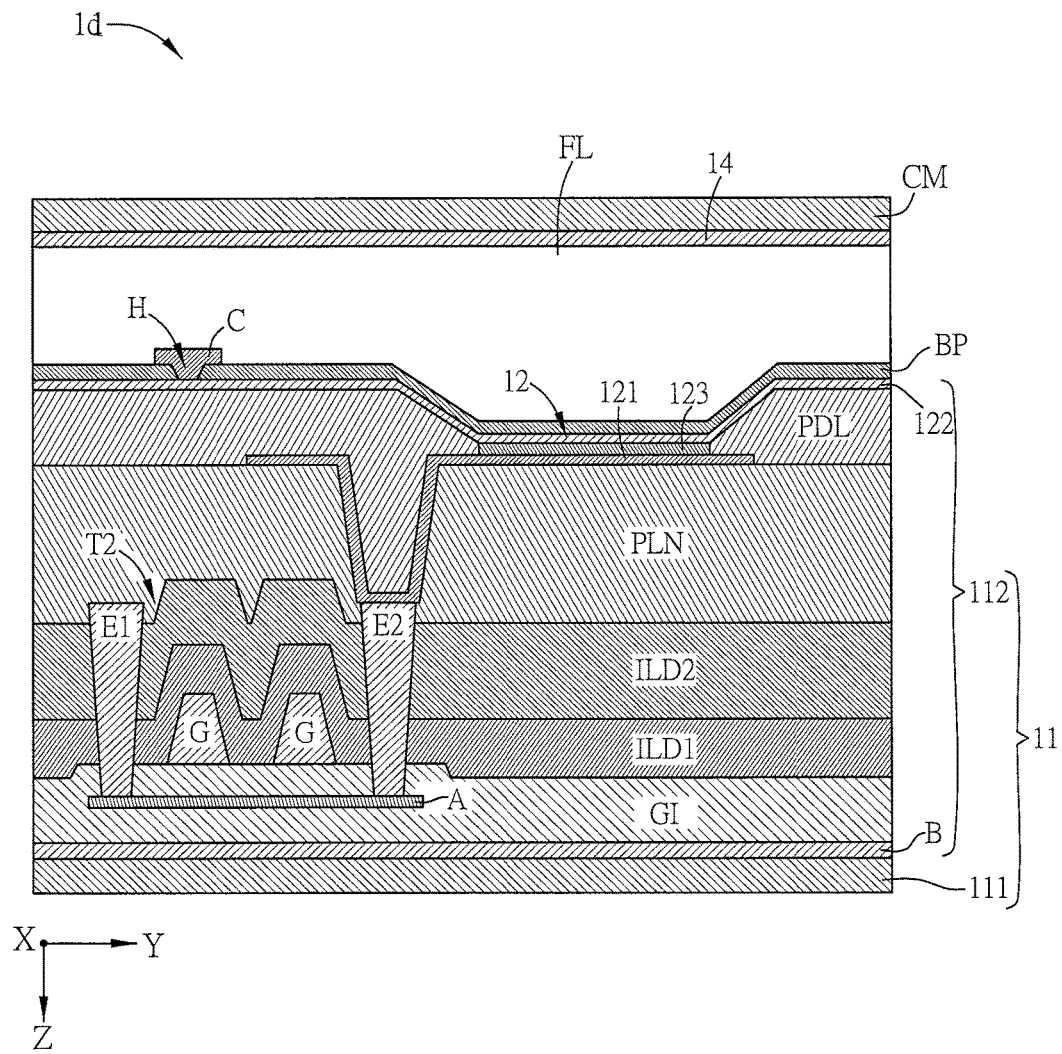
FIG. 3 is a sectional view of a part of the touch display device according to another embodiment of the disclosure.

FIG. 3 is a sectional view of a part of the touch display device 1d according to another embodiment of the disclosure.

Different from the touch display device 1 of FIG. 1A, the touch display device 1d of FIG. 3 further includes a reference electrode 14, which is disposed corresponding to the electrode pads of the touch sensing electrode (the second end electrode 122).

Figure 4A:
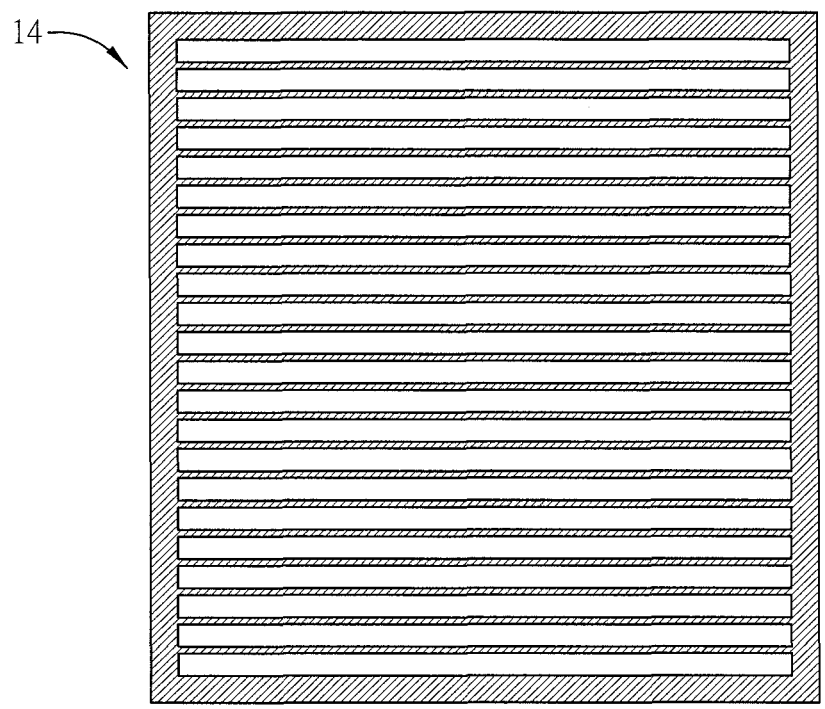
FIGS. 4A to 4C are schematic diagrams showing various aspects of the reference electrodes.
Figure 4B:
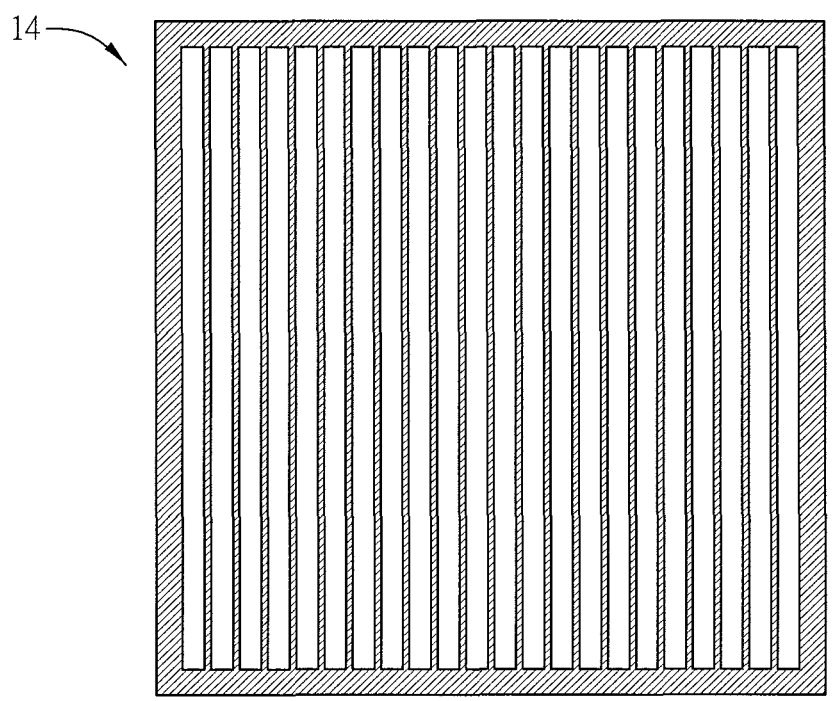
Figure 4C:
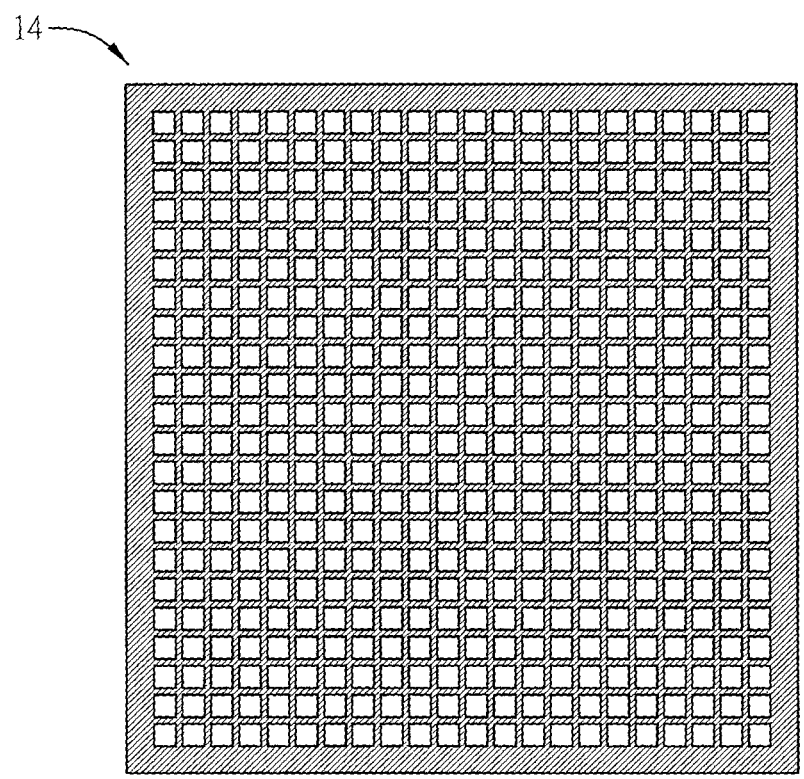

In some embodiments, the reference electrode 14 can be one of the patterned electrodes as shown in FIGS. 4A to 4C. Alternatively, the reference electrode 14 is a whole plate of electrode instead of the patterned electrode, and this disclosure is not limited. The reference electrode 14 can be disposed on the top surface or the bottom surface of the cover plate CM. Alternatively, the reference electrode 14 can be the metal frame or metal film of the display device. The material of the reference electrode 14 can comprise transparent material (e.g. ITO) or opaque material (e.g. metal or metal film), and this disclosure is not limited. In this embodiment, the reference electrode 14 is disposed on the bottom surface of the cover plate CM, and is made of transparent conductive material. The flexible layer FL is disposed between the reference electrode 14 and the touch sensing electrode (the second end electrode 122) so as to form a sensing capacitor for sensing the pressing in a third direction Z. Herein, the third direction Z is perpendicular to the first direction X and the second direction Y (the XY plane).

As mentioned above, the touch sensing electrode (the second end electrode 122) can sense the touch action in two directions (the XY plane), and the reference electrode 14 and the plurality of electrode pads P can form a plurality of sensing capacitors for sensing the pressing in the third direction Z.

Figure 5A:
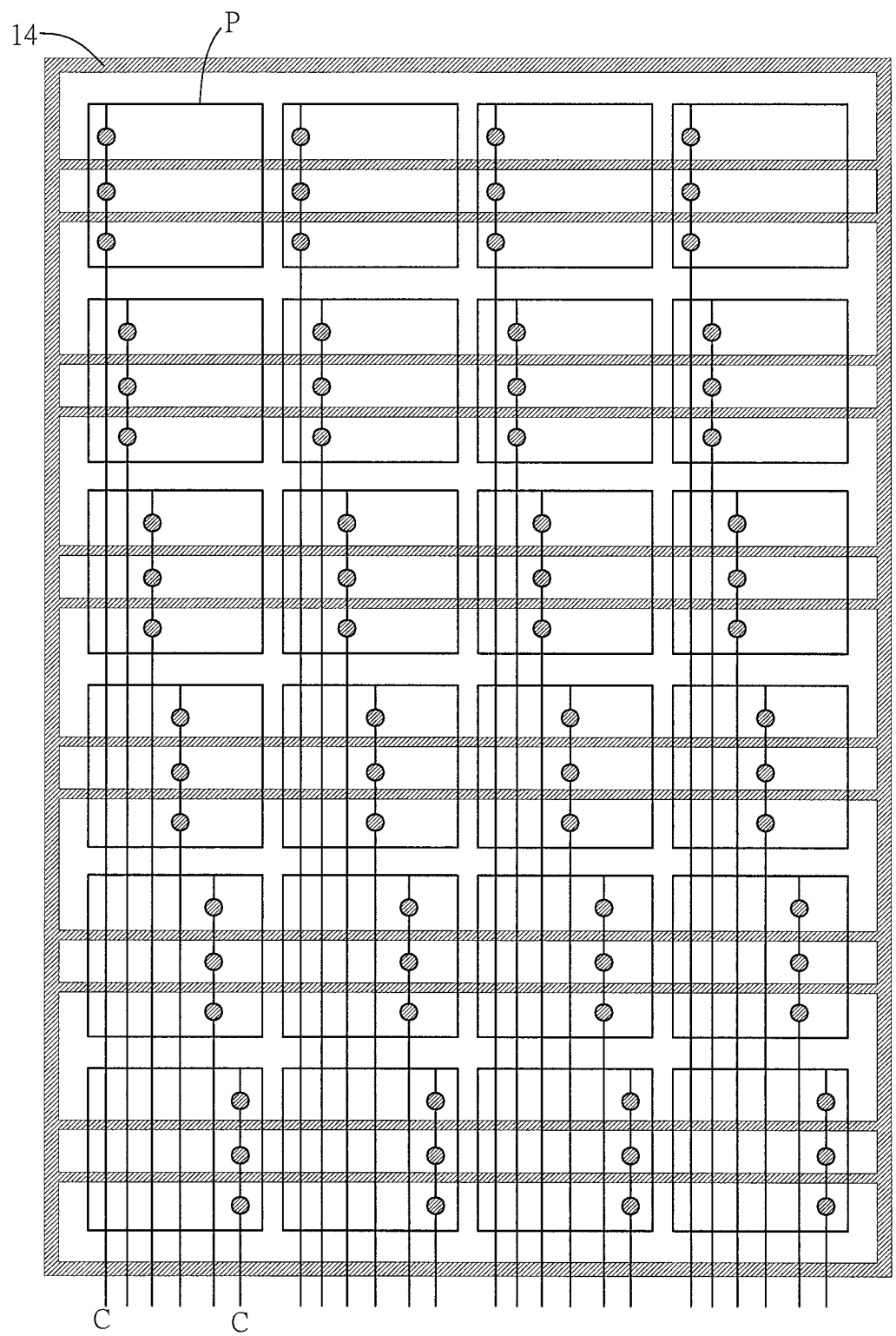
FIGS. 5A and 5B are top views of different aspects of the touch sensing electrode and the reference electrode.
Figure 5B:
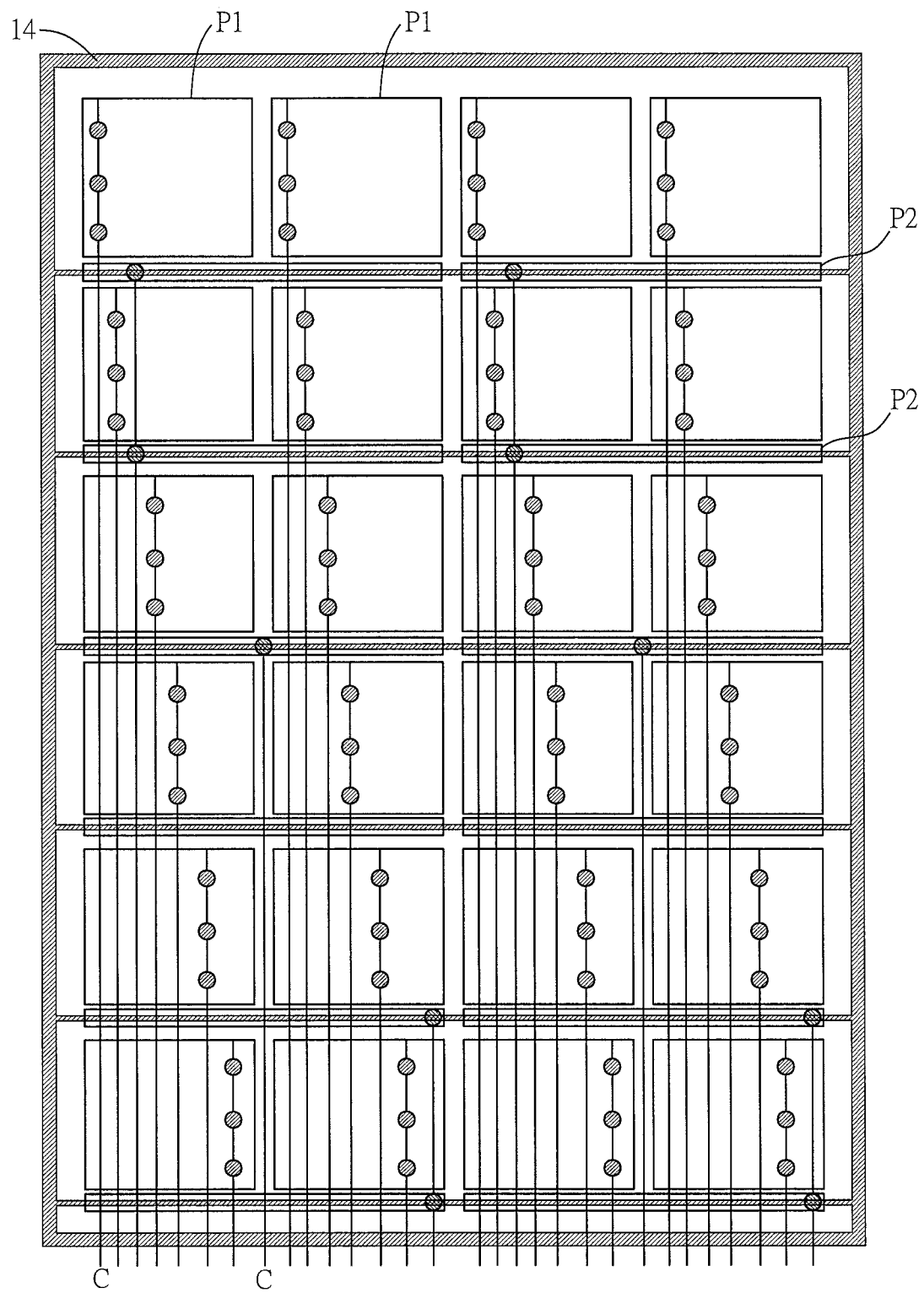

FIGS. 5A and 5B are top views of different aspects of the touch control electrode and the reference electrode.

In some embodiments, as shown in FIG. 5A, the electrode pads P of FIG. 1D are used to sense the touch signals in three directions. In other words, the touch signals in three directions are sensed by the electrode pads P. In practice, the functions of sensing the touch motions in the first direction X, the second direction Y and the third direction Z are integrated in the control IC.

In some embodiments, as shown in FIG. 5B, some electrode pads P1 are used to sensing the touch signal in the first direction X and the second direction Y (the XY plane), and some electrode pads P2 are used to sensing the touch signal in the third direction Z. In this embodiment, the electrode pads P1 for sensing the touch signals in the XY plane are arranged in a rectangular shape, and the electrode pads P2 for sensing the touch signals in the third direction Z are arranged in a stripe shape. To be noted, the shape of the electrode pads can be changed based on the design and requirements, and this disclosure is not limited. The electrode pads P1 and P2 are coupled to the control IC via at least one trace C, so that the number of the traces C of FIG. 5B is more than that of the FIG. 5A. In other words, the touch signals in the XY plane are sensed by the electrode pads P1, which are arranged in a rectangular shape, and touch signals in the Z direction are sensed by the electrode pads P2, which are arranged in a stripe shape. In practice, the function of sensing the touch motion in the third direction Z is separated from the functions of sensing the touch motions in the first direction X and the second direction Y by the control IC. In addition, the electrode pads P2 arranged in a stripe shape are disposed between two adjacent electrode pads P1.

The other technical features, driving method and controlling method of the touch display device 1d can be referred to the above-mentioned touch display device 1, and the detailed descriptions thereof will be omitted.

Figure 6A:
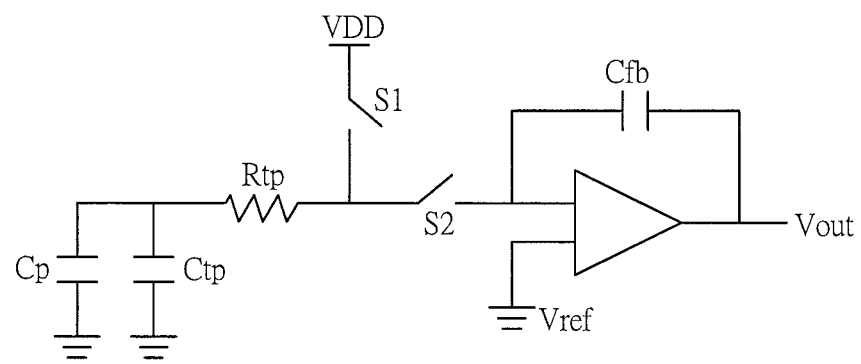
FIG. 6A is a schematic diagram showing a control circuit of the touch display device during a no-touch event.
Figure 6B:
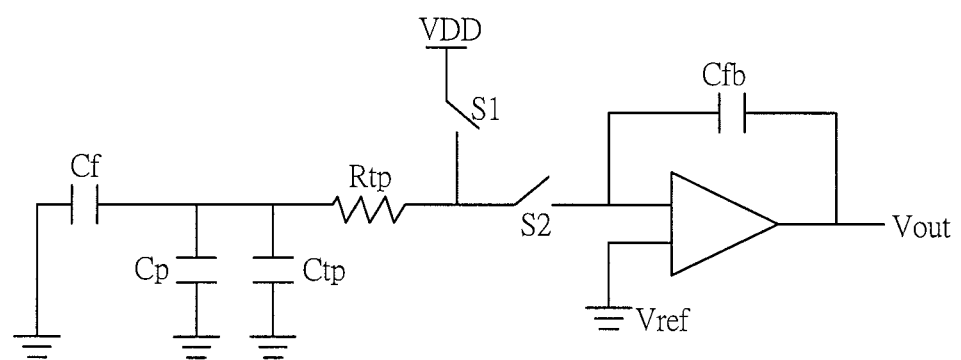
FIG. 6B is a schematic diagram showing a control circuit of the touch display device during a touch event on the first direction and the second direction.
Figure 6C:
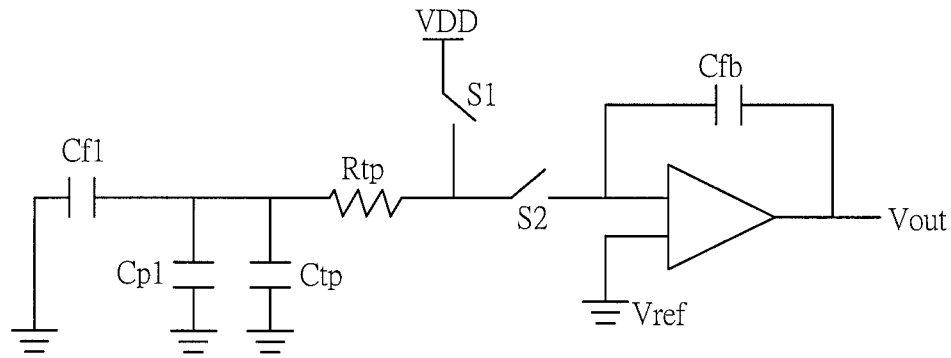
FIG. 6C is a schematic diagram showing a control circuit of the touch display device during a touch event on three directions.
Figure 6D:
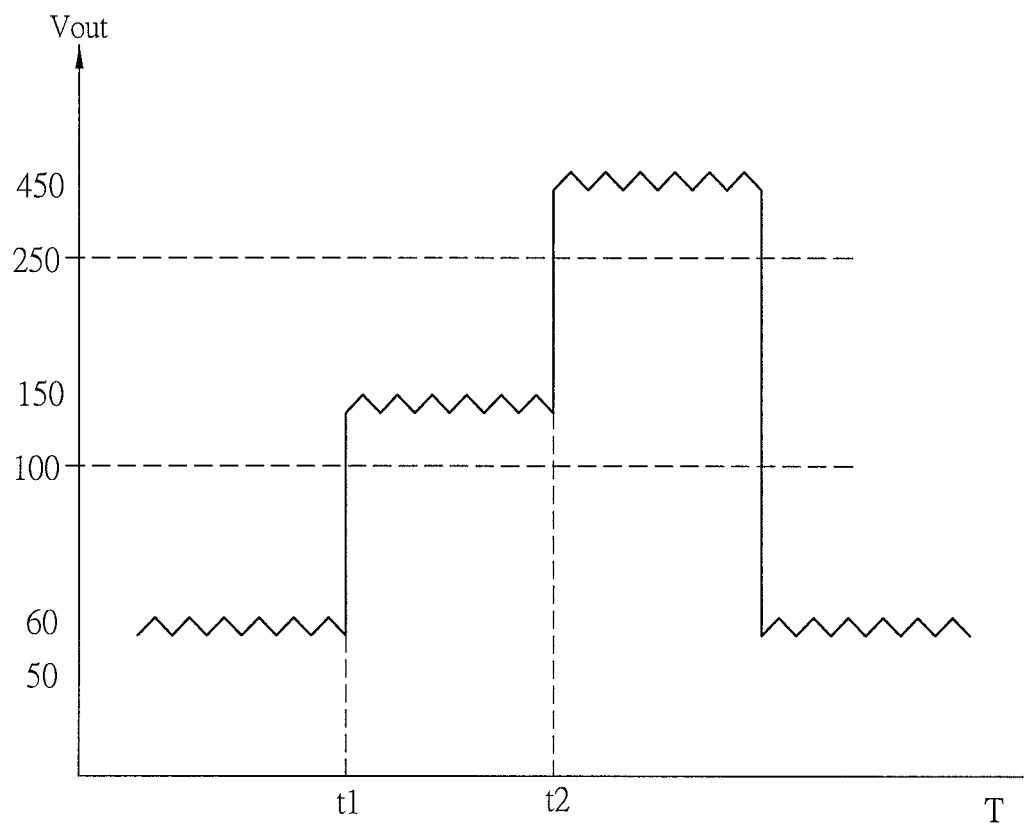
FIG. 6D is a schematic diagram showing the waveform of the outputted touch signal.

FIG. 6A is a schematic diagram showing a control circuit of the touch display device 1d during a no-touch event. FIG. 6B is a schematic diagram showing a control circuit of the touch display device 1d during a touch event on the first direction X and the second direction Y (the XY plane). FIG. 6C is a schematic diagram showing a control circuit of the touch display device 1d during a touch event on three directions X, Y and Z. FIG. 6D is a schematic diagram showing the waveform of the outputted touch signal Vout.

As shown in FIG. 6A, the capacitance signal in the non-touch event is shown as below:

$$\text{NoTouch\_Vout} = \frac{Ctp + Cp}{Cfb} \times (Vdd - Vref) \times n$$

In addition, as shown in FIG. 6B, the capacitance signal in the touch event on the XY plane (two dimensions) is shown as below:

$$\text{Touch\_Vout} = \frac{Ctp + Cp + Cf}{Cfb} \times (Vdd - Vref) \times n$$

As shown in FIG. 6C, the capacitance signal in the touch event on the XY plane and the Z direction (three dimensions) is shown as below:

$$\text{ForceTouch\_Vout} = \frac{Ctp + Cp1 + Cf1}{Cfb} \times (Vdd - Vref) \times n$$

Herein, Ctp is a self-capacitance of the sensing electrode for sensing a two dimensional touch event, Cp is a self-capacitance of the sensing electrode for sensing a three dimensional touch event, and Cf is a (touch) capacitance generated as, for example, a finger touches the touch display device.

As shown in FIG. 6D, the touch threshold for the touch motion on the XY plane is 100 units, and the touch threshold for the touch motion on the X, Y and Z directions (three dimensional) is 250 units. These two touch thresholds are both greater than the background value (60) in the non-touch event. Referring to FIG. 6D, a touch motion on the XY plane is detected at the time t1, and a touch motion in the third direction Z is detected at the time t2. The outputted touch signal Vout of the three dimensional touch motion is greater than the touch signal value of the touch motion on the XY plane. Accordingly, the control circuit can distinguish whether the touch motion is a touch motion on the XY plane or a three dimensional X, Y and Z touch motion based on the value of the touch signal Vout and generate the corresponding control action.

To be noted, in some embodiments, the cover plate CM usually has a thicker thickness (e.g. 0.5 mm), and the flexible layer FL usually has a relatively thinner thickness (100 μm or less). Since the thickness of the cover plate CM is much larger than the thickness of the flexible layer FL, the capacitance change between the reference electrode 14 and the electrode pads P is much greater than the capacitance change between the finger and the electrode pads P during the touch (press) motion in the third direction Z. Accordingly, the capacitance change caused by the finger can be omitted.

Figure 7A:
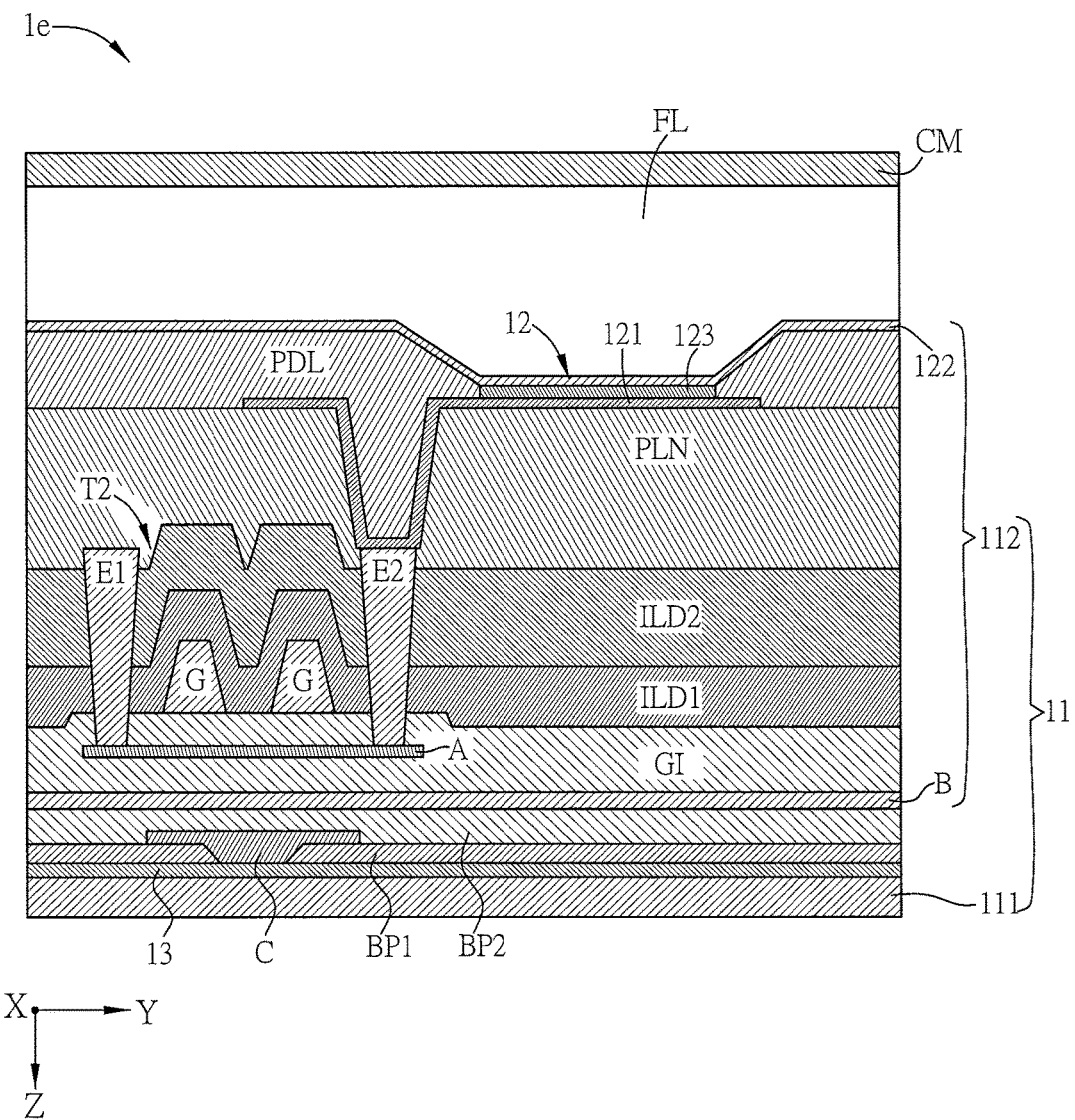
FIGS. 7A, 7C, 7D and 7E are sectional views of a part of touch display devices according to different embodiments of the disclosure.
Figure 7B:
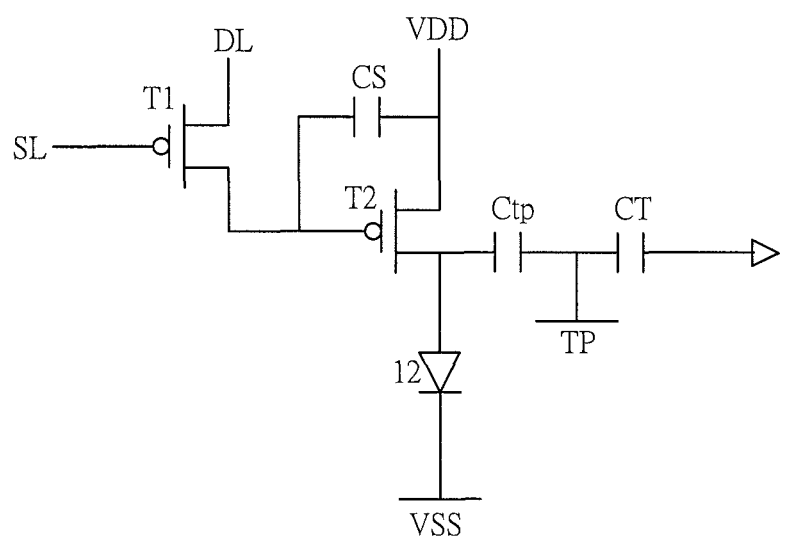
FIG. 7B is an equivalent circuit diagram of a pixel structure of the touch display device of FIG. 7A.

FIGS. 7A, 7C, 7D and 7E are sectional views of a part of touch display devices 1e~1h according to different embodiments of the disclosure, and FIG. 7B is an equivalent circuit diagram of a pixel structure of the touch display device 1e of FIG. 7A.

Different from the touch display device 1a of FIG. 2A, the touch display device 1e of FIG. 7A is configured with a layer of a touch sensing electrode 13 in the TFT structure 112 instead of utilizing the second end electrode 122 as the touch sensing electrode. In this case, the touch sensing electrode 13 is disposed above the second end electrode 122 or between the first end electrode 121 and the substrate 111, and is located corresponding to the first end electrode 121 or the second end electrode 122. In this embodiment, the touch sensing electrode 13 is disposed on the substrate 111 and is located between the buffer layer B and the substrate 111 and corresponding to the second end electrode 122. In addition, a barrier layer BP1 is configured to cover the touch sensing electrode 13, and the trace C is disposed on the barrier layer BP1 and filled into the through hole of the barrier layer BP1 for coupling to the touch sensing electrode 13. Moreover, another barrier layer BP2 is configured to cover the trace C and the barrier layer BP1, and located between the buffer layer B and the barrier layer BP1.

The touch sensing electrode 13 may include a plurality of electrode pads P as the above-mentioned touch sensing electrode. The details thereof have been described in the above embodiment, so the descriptions thereof will be omitted. Besides, the touch display device 1e of this embodiment also has a full-time driving mode and a part-time driving mode. The details thereof have been described in the above embodiment, so the descriptions thereof will be omitted.

FIG. 7B is an equivalent circuit diagram of a pixel structure of the touch display device 1e of FIG. 7A. The cathode of the light emitting element 12 is connected to the second power source VSS, and one end of the touch capacitor CT is connected to the anode of the light emitting element 12. In other embodiments, when the touch sensing electrode 13 is disposed above the second end electrode 122, the anode of the light emitting element 12 is connected to the second power source VSS, and one end of the touch capacitor CT is connected to the cathode of the light emitting element 12. This disclosure is not limited.

As shown in FIG. 7B, during the sensing period ST in the part-time driving mode, a plurality of driving signals TP (e.g. pulse signals) are sent to the touch sensing electrode 13 within a frame time FT. During the sensing period ST, the waveforms of the signals transmitted to the scan line SL and the data line DL and the waveforms of the first power source VDD and the second power source VSS are corresponding to and identical to the waveform of the driving signal TP. This configuration can prevent the change of the current flowing through the light emitting element 12 so as to maintain the display effect of the touch display device 1e.

The other technical features, driving method and controlling method of the touch display device 1e can be referred to the above-mentioned touch display device 1, and the detailed descriptions thereof will be omitted.

Figure 7C:
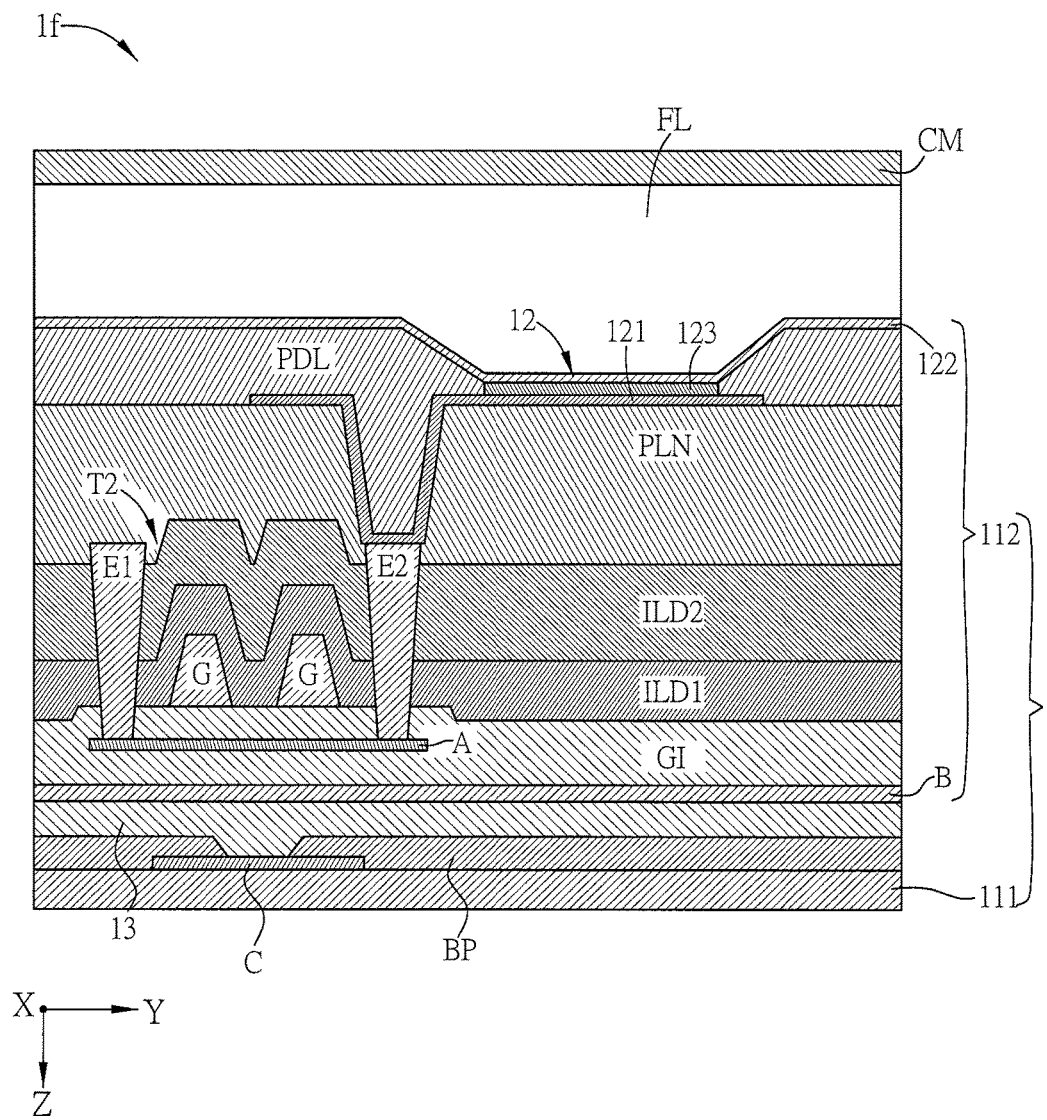

Different from the touch display device 1e of FIG. 7A, the touch display device 1f of FIG. 7C has one barrier layer BP. In this embodiment, the trace C is disposed on the substrate 111, and the barrier layer BP is disposed on the trace C. The touch sensing electrode 13 is disposed between the buffer layer B and the barrier layer BP and electrically connected to the trace C via the through hole of the barrier layer BP.

Figure 7D:
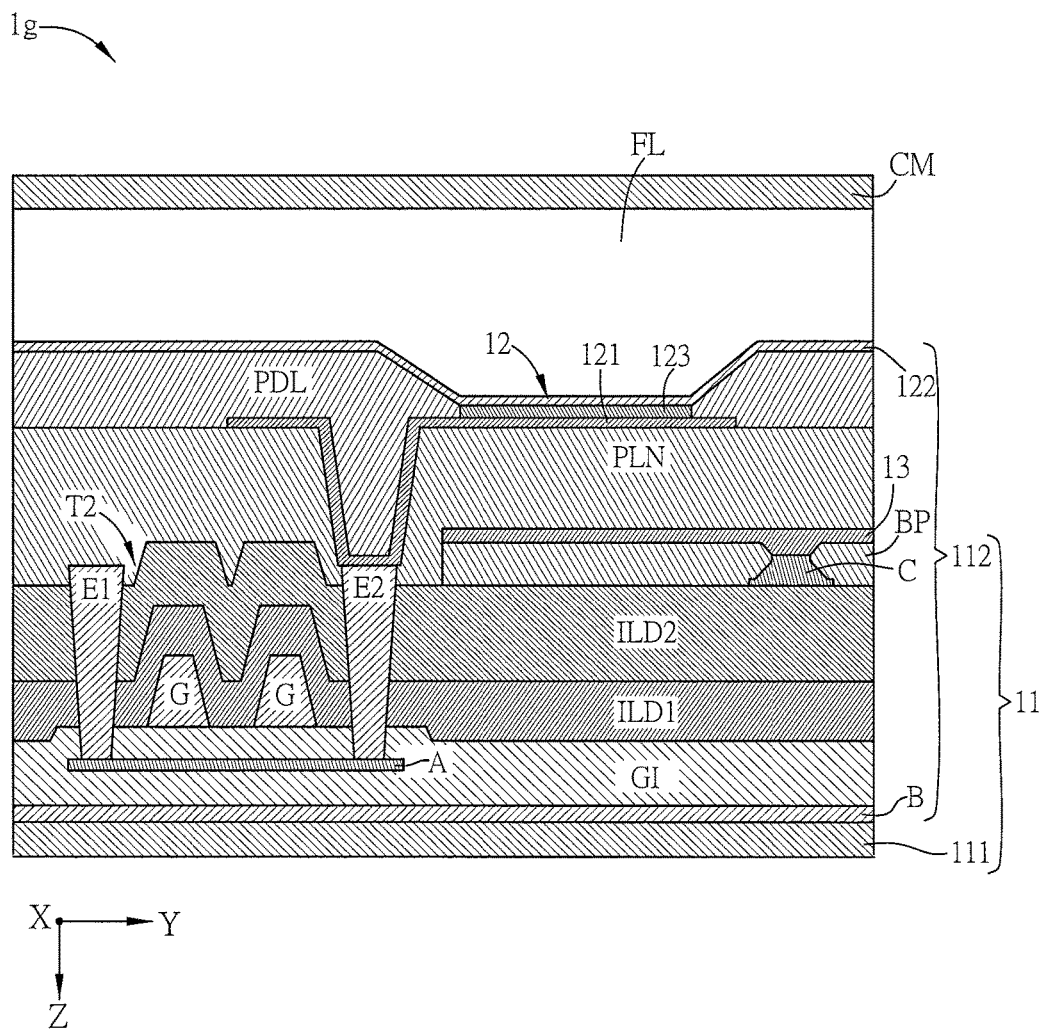

Different from the touch display device 1f of FIG. 7C, the touch sensing electrode 13 of the touch display device 1g of FIG. 7D is disposed above the second dielectric layer ILD2. In this embodiment, the trace C is disposed on the second dielectric layer ILD2, and the barrier layer BP covers the trace C. The touch sensing electrode 13 is disposed on the barrier layer BP and electrically connected to the trace C via the through hole of the barrier layer BP. In addition, the planarization layer PLN entirely covers the touch sensing electrode 13 and the barrier layer BP.

Figure 7E:
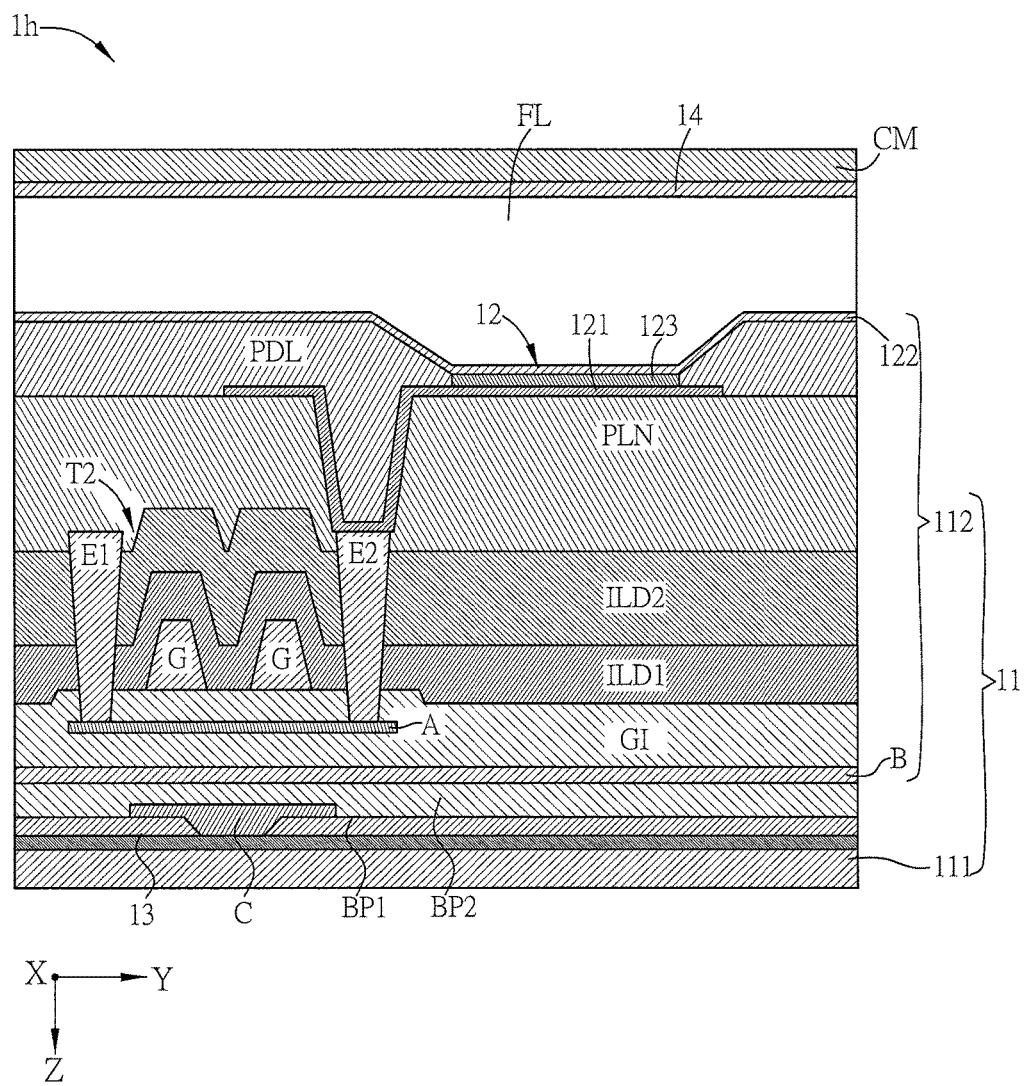

Different from the touch display device 1e of FIG. 7A, the touch display device 1h of FIG. 7E further includes a reference electrode 14, which is disposed corresponding to the electrode pads P of the touch sensing electrode 13. In this embodiment, the reference electrode 14 is disposed on the bottom surface of the cover plate CM and is made of transparent conductive material, for example. The flexible layer FL is disposed between the reference electrode 14 and the touch sensing electrode 13 to form a sensing capacitor for sensing the pressing in the third direction Z. The technical features of the reference electrode 14 and the relationship between the reference electrode 14 and the touch sensing electrode 13 have been described in the above embodiments with reference to FIGS. 3 to 6D, so the detailed descriptions thereof will be omitted.

The other technical features, driving method and controlling method of the touch display devices 1e~1h can be referred to the above-mentioned touch display device 1, and the detailed descriptions thereof will be omitted.

As mentioned above, in the touch display device of this disclosure, the first end electrode or the second end electrode of the light emitting element is functioned as the touch sensing electrode of the touch display device, or a touch sensing electrode is disposed on the second end electrode or between the first end electrode and the substrate and is located corresponding to the first end electrode or the second end electrode. Moreover, a reference electrode can be disposed corresponding to the first end electrode or the second end electrode. According to the above structure, the manufacturing process of the touch sensing electrode can be integrated in the TFT manufacturing process, and the circuit for controlling the touch function and the circuit for controlling the display function can be integrated in the same IC based on the self-capacitance touch control method. Thus, the manufacturing processes of the touch panel and cost of the control IC can be reduced, and the touch display device of the disclosure has reduced manufacturing steps and less components.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:
1. A touch display device, comprising:
 a thin-film transistor (TFT) substrate having a substrate and a TFT structure, wherein the TFT structure is disposed on the substrate and comprises a driving transistor; and
 a light-emitting element disposed on the TFT structure and having a first end electrode, a light-emitting layer and a second end electrode, wherein the first end electrode is electrically connected with the driving transistor, and the light-emitting layer is disposed between the first end electrode and the second end electrode;

wherein, the first end electrode or the second end electrode is a touch sensing electrode of the touch display device.

2. The touch display device of claim 1, wherein driving modes of the touch display device comprises a full-time driving mode and a part-time driving mode.

3. The touch display device of claim 2, wherein when the touch display device operates in the part-time driving mode, a frame time of the touch display device comprises a display period and a sensing period.

4. The touch display device of claim 3, wherein the first end electrode is coupled to a first power line, the second end electrode is coupled to a second power line, and during the sensing period, at least a first pulse signal is transmitted to the touch sensing electrode, and at least a second pulse signal is transmitted to the first power line or the second power line.

5. The touch display device of claim 3, wherein the driving transistor is in a cutoff status during the sensing period.

6. The touch display device of claim 3, wherein the first end electrode is coupled to a first power line, the second end electrode is coupled to a second power line, and during the sensing period, a voltage applied to the first power line is less than a voltage applied to the second power line.

7. The touch display device of claim 1, wherein the touch sensing electrode comprises a plurality of electrode pads, and each of the electrode pads is electrically connected to at least a trace.

8. The touch display device of claim 7, further comprising:
a reference electrode disposed corresponding to the electrode pads of the touch sensing electrode.

9. The touch display device of claim 8, further comprising:
a flexible layer disposed between the reference electrode and the touch sensing electrode.

10. The touch display device of claim 8, wherein a part of the electrode pads are used for sensing touch signals of a first direction and a second direction, another part of the electrode pads are used for sensing touch signals of a third direction, and the third direction is perpendicular to the first direction and the second direction.

11. A touch display device, comprising:
a thin-film transistor (TFT) substrate having a substrate and a TFT structure, wherein the TFT structure is disposed on the substrate and comprises a driving transistor;
a light-emitting element disposed on the TFT structure and having a first end electrode, a light-emitting layer and a second end electrode, wherein the first end electrode is electrically connected with the driving transistor, and the light-emitting layer is disposed between the first end electrode and the second end electrode; and
a touch sensing electrode disposed above the second end electrode or between the first end electrode and the substrate, and located corresponding to the first end electrode or the second end electrode.

12. The touch display device of claim 11, wherein driving modes of the touch display device comprises a full-time driving mode and a part-time driving mode.

13. The touch display device of claim 12, wherein the touch sensing electrode comprises a plurality of electrode pads, and each of the electrode pads is electrically connected to at least a trace.

14. The touch display device of claim 13, further comprising:
a reference electrode disposed corresponding to the electrode pads of the touch sensing electrode.

15. The touch display device of claim 14, further comprising:
a flexible layer disposed between the reference electrode and the touch sensing electrode.

16. The touch display device of claim 14, wherein a part of the electrode pads are used for sensing touch signals of a first direction and a second direction, another part of the electrode pads are used for sensing touch signals of a third direction, and the third direction is perpendicular to the first direction and the second direction.

17. A touch display device, comprising:
a thin-film transistor (TFT) substrate having a substrate and a TFT structure, wherein the TFT structure is disposed on the substrate and comprises a driving transistor;
a light-emitting element disposed on the TFT structure and having a first end electrode, a light-emitting layer and a second end electrode, wherein the first end electrode is electrically connected with the driving transistor, and the light-emitting layer is disposed between the first end electrode and the second end electrode; and
a reference electrode disposed corresponding to the first end electrode or the second end electrode.

18. The touch display device of claim 17, wherein the first end electrode or the second end electrode is a touch sensing electrode of the touch display device, wherein the touch sensing electrode comprises a plurality of electrode pads, and each of the electrode pads is electrically connected to at least a trace.

19. The touch display device of claim 18, further comprising:
a flexible layer disposed between the reference electrode and the touch sensing electrode.

20. The touch display device of claim 18, wherein a part of the electrode pads are used for sensing touch signals of a first direction and a second direction, another part of the electrode pads are used for sensing touch signals of a third direction, and the third direction is perpendicular to the first direction and the second direction.

* * * * *